(12) United States Patent
Chen et al.

(10) Patent No.: US 12,255,171 B2
(45) Date of Patent: Mar. 18, 2025

(54) WAFER BONDING SYSTEM AND METHOD OF USING THE SAME

(71) Applicant: Taiwan Semiconductor Manufacturing Co., Ltd., Hsinchu (TW)

(72) Inventors: Han-De Chen, Hsinchu (TW); Yun Chen Teng, New Taipei (TW); Chen-Fong Tsai, Hsinchu (TW); Jyh-Cherng Sheu, Hsinchu (TW); Huicheng Chang, Tainan (TW); Yee-Chia Yeo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 399 days.

(21) Appl. No.: 17/412,768

(22) Filed: Aug. 26, 2021

(65) Prior Publication Data

US 2023/0067346 A1 Mar. 2, 2023

(51) Int. Cl.
*H01L 23/00* (2006.01)
*H01L 21/683* (2006.01)

(52) U.S. Cl.
CPC .......... *H01L 24/74* (2013.01); *H01L 21/6838* (2013.01); *H01L 24/80* (2013.01); *H01L 2224/8009* (2013.01); *H01L 2224/80093* (2013.01); *H01L 2224/80895* (2013.01); *H01L 2224/80896* (2013.01)

(58) Field of Classification Search
CPC ..... H01L 24/74; H01L 21/6838; H01L 24/80; H01L 2224/8009; H01L 2224/80093; H01L 2224/80895; H01L 2224/80896; H01L 24/08; H01L 24/13; H01L 24/75; H01L 24/81; H01L 21/67092; H01L 24/94; H01L 2224/94; H01L 2224/95091
USPC ....................................................... 438/455
See application file for complete search history.

(56) References Cited

U.S. PATENT DOCUMENTS

| | | | | |
|---|---|---|---|---|
| 2013/0312907 A1* | 11/2013 | Oh | ....................... | B32B 38/1858 156/382 |
| 2014/0338813 A1* | 11/2014 | Ookawa | .................. | B32B 37/10 156/60 |
| 2019/0228995 A1* | 7/2019 | Wimplinger | .......... | H01L 21/187 |
| 2021/0287926 A1* | 9/2021 | Eto | ................... | H01L 21/68721 |

\* cited by examiner

*Primary Examiner* — Caleen O Sullivan
(74) *Attorney, Agent, or Firm* — Slater Matsil, LLP

(57) ABSTRACT

In an embodiment, a wafer bonding system includes a chamber, a gas inlet and a gas outlet configured to control a pressure of the chamber to be in a range from $1\times10^{-2}$ mbar to 1520 torr, a first wafer chuck having a first surface to support a first wafer, and a second wafer chuck having a second surface to support a second wafer, the second surface being opposite the first surface, the second wafer chuck and the first wafer chuck being movable relative to each other, wherein the second surface that supports the second wafer is divided into zones, wherein a vacuum pressure of each zone is controlled independently of other zones.

20 Claims, 8 Drawing Sheets

WAFER BONDING SYSTEM AND METHOD OF USING THE SAME

BACKGROUND

In wafer-to-wafer bonding technology, various methods have been developed to bond two package components (such as wafers) together. The available bonding methods include fusion bonding, eutectic bonding, direct metal bonding, hybrid bonding, and the like. In fusion bonding, an oxide surface of a wafer is bonded to an oxide surface or a silicon surface of another wafer. In eutectic bonding, two eutectic materials are placed together, and a high pressure and a high temperature are applied. The eutectic materials are hence melted. When the melted eutectic materials solidify, the wafers bond together. In direct metal-to-metal bonding, two metal pads are pressed against each other at an elevated temperature, and the inter-diffusion of the metal pads causes the bonding of the metal pads. In hybrid bonding, the metal pads of two wafers are bonded to each other through direct metal-to-metal bonding, and an oxide surface of one of the two wafers is bonded to an oxide surface or a silicon surface of the other wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
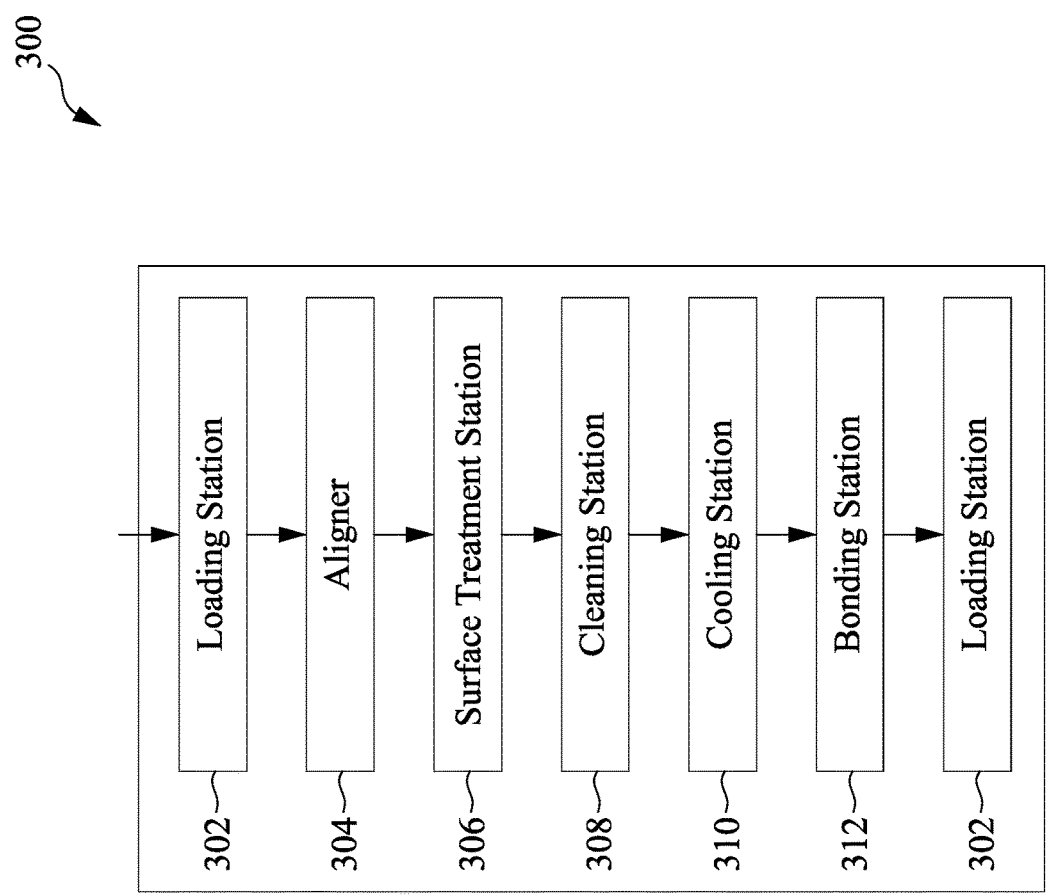
FIG. 1 schematically illustrates a process flow and a bonding system in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A wafer bonding system is provided in accordance with various exemplary embodiments. The wafer bonding system may allow for the bonding of a first semiconductor wafer to a second semiconductor wafer in a bonding environment that has a pressure that may range from a vacuum to above 760 torr. When the bonding is carried out in a bonding environment that has an ambient pressure that is higher than 760 torr, a bonding wave velocity can be reduced which minimizes local stresses in the first semiconductor wafer and the second semiconductor wafer and minimizes bonding-induced distortion. This leads to improved wafer-to-wafer bonding alignment. When the bonding is carried out at ambient pressures that are lower than 760 torr, the bonding wave velocity is increased which leads to a reduced bonding time needed to bond the first semiconductor wafer to the second semiconductor wafer. This in turn allows the wafer bonding system to bond wafers together at a faster rate and therefore increase the wafer per hour (WPH) processing rate. In addition, the wafer bonding system may allow for a bottom wafer chuck that is divided into zones. The vacuum pressure of each zone can be tuned in order to control the mechanical properties (e.g., young's modulus and shear modulus) of the portions of the semiconductor wafer in each zone on the bottom wafer chuck. Since the mechanical properties of the semiconductor wafer are dependent on the crystal directions, the bonding wave velocity is also different for different crystal directions and tuning the vacuum pressure of each zone allows the control of the bonding wave velocity in that zone.

FIG. 1 schematically illustrates a process flow and a wafer bonding system (bonder) 300 for performing the process flow. Wafer bonding system 300 is used to bond two package components (e.g., using hybrid bonding). The process flow in accordance with the embodiments is briefly described below, and the details of the process flow and the wafer bonding system 300 are discussed, referencing FIGS. 2 through 8B. In some embodiments, the wafer bonding system 300 can be used to bond the two package components through semiconductor-on-insulator (SOI) bonding, fusion bonding (e.g., hydrophilic bonding or hydrophobic bonding), hybrid bonding, or the like.

Figure 2:
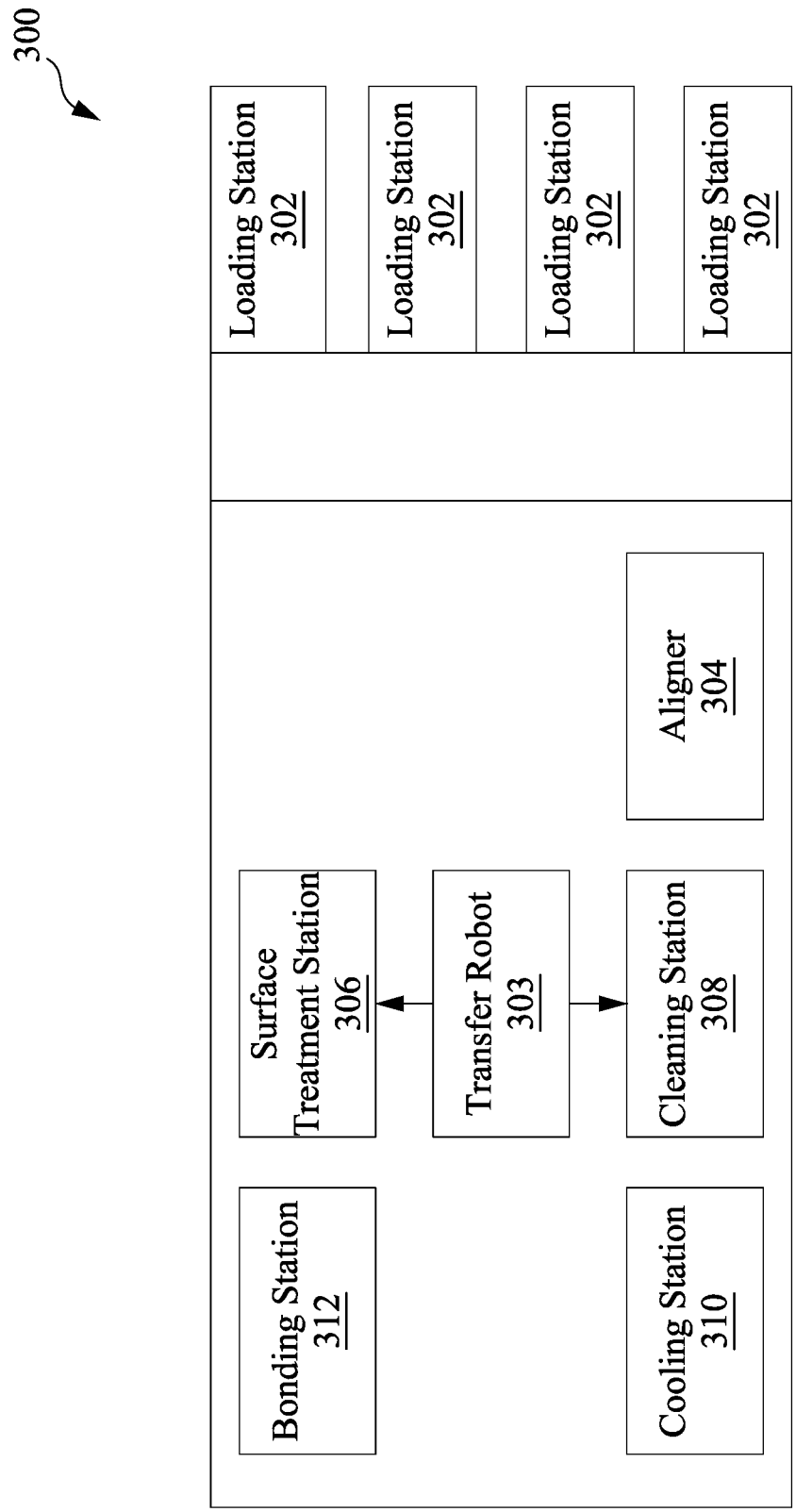
FIG. 2 illustrates a top-view of the bonding system in accordance with some embodiments.

FIG. 2 shows a top-view of the wafer bonding system 300. Referring to FIGS. 1 and 2, the package components that are to be bonded (for example, package components 100 and 200 in FIGS. 3 and 4, respectively) are loaded into wafer bonding system 300 through one or more of the loading stations 302. Wafer bonding system 300 may be located in a controlled environment filled with, for example, clean air or nitrogen. Alternatively, wafer bonding system 300 is located in open air. A transfer robot 303 transfers the package components to an aligner 304 that is used to align the package components to desired angular positions. Next, the transfer robot 303 transfers the package components to a surface treatment station 306, where a surface treatment/activation is performed on the surfaces of the package components. In the surface treatment, the exposed surfaces of the dielectric materials in the package components are activated. In some embodiments, the surface treatment includes a plasma activation step. Next, the transfer robot 303 transfers the package components to a cleaning station 308, where a cleaning step is then performed on the package components to remove metal oxides, chemicals, particles, and other undesirable substances from the surfaces of the package components. The cleaning station 308 is configured to perform the cleaning step in accordance with some embodiments.

Next, the transfer robot 303 transfers the package components to a cooling station 310, where cooling water is used to cool the package components to a temperature that may be in a range from about 15° C. to about 40° C. The transfer robot 303 then transfers the package components to a bonding station 312, where bonding is then performed to bond the package components together. After the bonding, the bonded package components may then be transferred to the loading station 302 where the package components are unloaded from the wafer bonding system.

Figure 3:
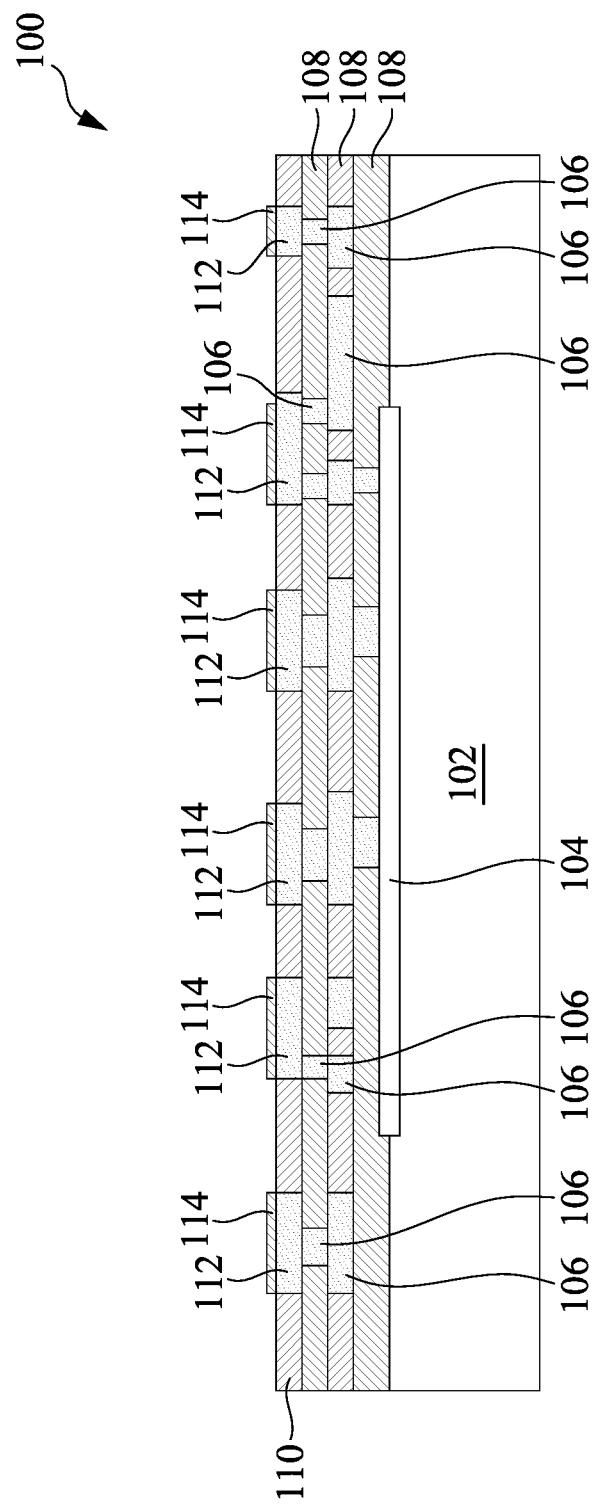
FIGS. 3 through 6 illustrate the cross-sectional views of intermediate stages in the hybrid bonding of two package components in accordance with some embodiments.
Figure 4:
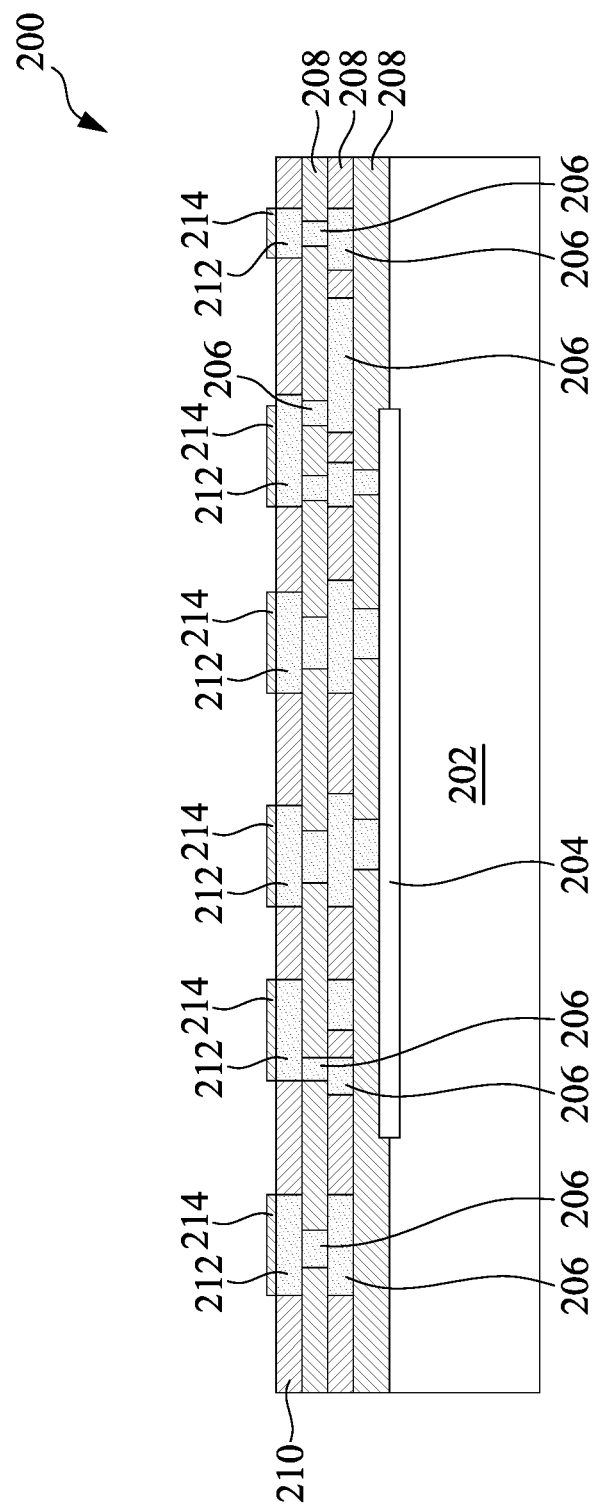

A detailed bonding process is discussed herein, referencing FIGS. 3 through 8B. Referring to FIGS. 3 and 4, package component 100 and package component 200 are illustrated. Package component 100 may comprise a device wafer, a package substrate an interposer wafer, or the like. In some embodiments, the package component 100 includes a semiconductor wafer which may comprise doped or undoped silicon. In some embodiments, the package component 100 includes an oxide wafer. The package component 100 may also include an active layer of a semiconductor-on-insulator (SOI) substrate. In some embodiments, the package component 100 may include other semiconductor materials such as gallium nitride or the like. In the embodiments in which package component 100 comprises a device wafer, package component 100 may include semiconductor substrate 102, which may be, for example, a silicon substrate, although other semiconductor substrates are also usable. Active devices 104 may be formed on a surface of substrate 102, and may include, for example, transistors. Metal lines and vias 106 are formed in dielectric layers 108, which may be low-k dielectric layers in some embodiments. The low-k dielectric layers 108 may have dielectric constants (k values) lower than, for example, about 3.5, lower than about 3.0, or lower than about 2.5. Dielectric layers 108 may also comprise non-low-k dielectric materials with dielectric constants (k values) greater than 3.9. Metal lines and vias 106 may comprise copper, aluminum, nickel, tungsten, or alloys thereof. Metal lines and vias 106 interconnect active devices 104, and may connect active devices 104 to the overlying metal pads 112.

In alternative embodiments, package component 100 is an interposer wafer, which is free from active devices therein. Package component 100 may or may not include passive devices (not shown) such as resistors, capacitors, inductors, transformers, and the like in accordance with some embodiments.

In yet alternative embodiments, package component 100 is a package substrate. In some embodiments, package component 100 includes laminate package substrates, wherein conductive traces 106 (which are schematically illustrated) are embedded in laminate dielectric layers 108. In alternative embodiments, package components 100 are build-up package substrates, which comprise cores (not shown) and conductive traces (represented by 106) built on the opposite sides of the cores.

In each of the embodiments wherein package component 100 is a device wafer, an interposer wafer, a package substrate, or the like. Surface dielectric layer 110 is formed at the surface of package component 100. In some embodiments, surface dielectric layer 110 is a silicon containing a dielectric layer, which may comprise silicon oxide, SiON, SiN, or the like. Metal pads 112 are formed in surface dielectric layer 110 and may be electrically coupled to active devices 104 through metal lines and vias 106. Metal pads 112 may also be formed from copper, aluminum, nickel, tungsten, or alloys thereof. The top surface of surface dielectric layer 110 and the top surfaces of metal pads 112 are substantially level with each other. FIG. 3 also illustrates metal oxides regions 114 formed on the surfaces of metal pads 112. Metal oxide regions 114 may be the native oxide regions that are formed due to the exposure of metal pads 112 to open air.

In the embodiments wherein package component 100 is a device wafer, surface dielectric layer 110 and metal pads 112, which are used for the subsequent bonding, may be on the front side (the side with active devices 104) or the back side of substrate 102, although FIG. 3 illustrates that surface dielectric layer 110 and metal pads 112 are on the front side of substrate 102.

FIG. 4 illustrates package component 200, which is to be bonded to package component 100. Package component 200 may also be selected from a device wafer, an interposer wafer, a package substrate, and the like. In some embodiments, the package component 200 includes a semiconductor wafer which may comprise doped or undoped silicon. In some embodiments, the package component 200 includes an oxide wafer. The package component 200 may also include an active layer of a semiconductor-on-insulator (SOI) substrate. In some embodiments, the package component 200 may include other semiconductor materials such as gallium nitride or the like. In the illustrated FIG. 4, package component 200 includes substrate 202, active devices 204, dielectric layers 208, metal lines and vias 206 in dielectric layers 208, surface dielectric layer 210, and metal pads 212. Package component 200 may have a structure similar to what is described for package component 100, and the details are not repeated herein. FIG. 3 through 8B illustrate a hybrid bonding process in which the package component 200 is bonded to package component 100. The materials of the features in package component 200 may be found by referring to the like features in package component 100, with the like features in package component 100 starting with number "1," which features correspond to the features in package component 200 and having reference numerals starting with number "2."

After aligner 304 is used to align the package component 100 to a desired angular position, the package component 100 is loaded into surface treatment station 306 by the transfer robot 303, which is a part of the wafer bonding system 300 in FIG. 2. A surface treatment is performed on the surface of package component 100. In some embodiments, the surface treatment includes a plasma treatment.

The plasma treatment may be performed in a vacuum environment (a vacuum chamber, not shown), for example, which is a part of the surface treatment station 306 (FIG. 2). The process gas used for generating the plasma may be a hydrogen-containing gas, which includes a first gas including hydrogen ($H_2$) and argon (Ar), a second gas including $H_2$ and nitrogen ($N_2$), or a third gas including $H_2$ and helium (He). Through the treatment, the number of OH groups at the surface of dielectric layer 110 increases, which is beneficial for forming strong fusion bonds. Furthermore, the hydrogen helps reduce the metal oxide 114 on the surfaces of metal pads 112 back to metal. The plasma treatment may also be performed using pure or substantially pure $H_2$, Ar, or $N_2$ as the process gas, which treats the surfaces of metal pads 112 and surface dielectric layer 110 through reduction and/or bombardment. Using surface treatment station 306 (FIG. 2), package component 200 is also treated; the treatment is essentially the same as the treatment of package component 100.

Figure 5:
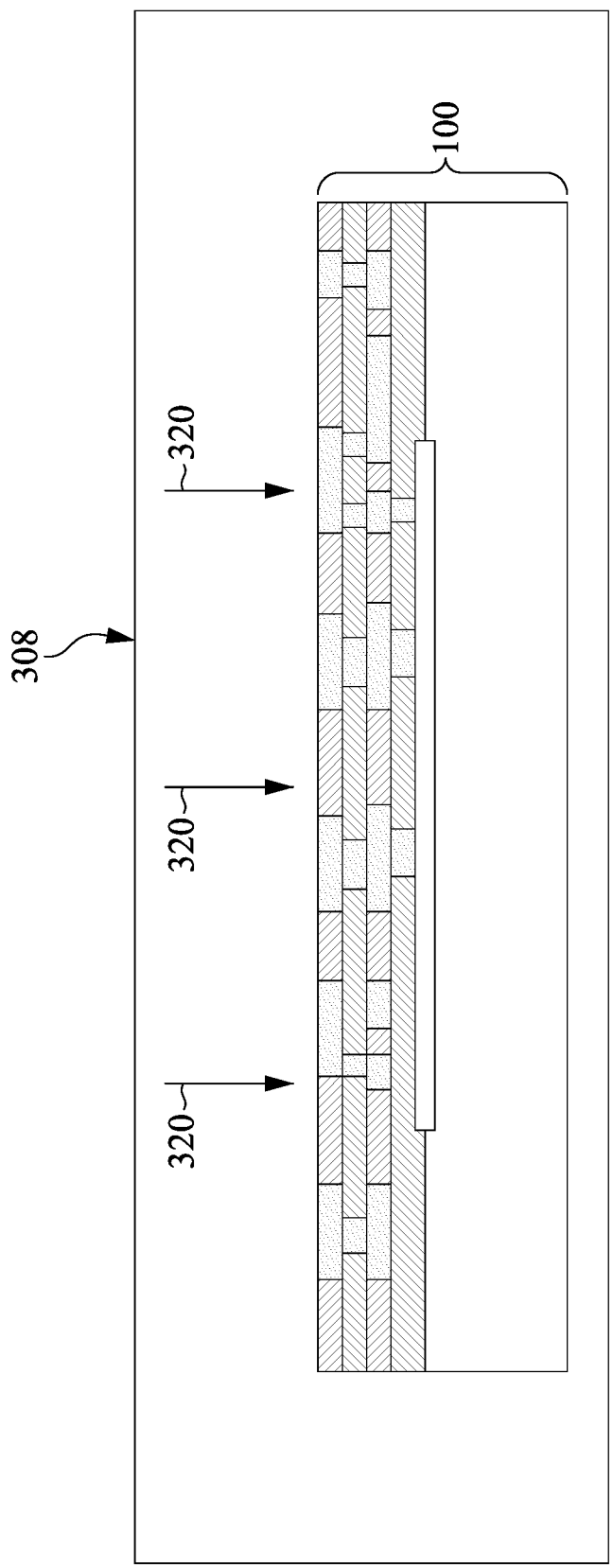

Next, referring to FIG. 5, package component 100 (and/or 200) is transferred to cleaning station 308 by the transfer robot 303, and a chemical cleaning and a De-Ionized (DI) water cleaning/rinse are performed on package component 100. The cleaning station 308 includes chamber 405, which may be sealed to confine the chemical vapors; the chemical vapors are evaporated from the chemicals used in the cleaning processes performed inside chamber 405. Wafer 200 may be also treated in surface treatment station 306 and cleaned in cleaning station 308 in a way similar to the treating of wafer 100. Next, package components 100 and/or 200 are transferred into the cooling station 310 (shown in FIG. 2) by the transfer robot 303. The package components 100 and/or 200 are placed on a wafer platen in the cooling station, and cooling water is flowed through the wafer platen to cool the package components 100 and 200 to a temperature that may be in a range from about 15° C. to about 40° C. The transfer robot 303 then transfers the package components to a bonding station 312, where bonding is then performed to bond the package components together.

Figure 6:
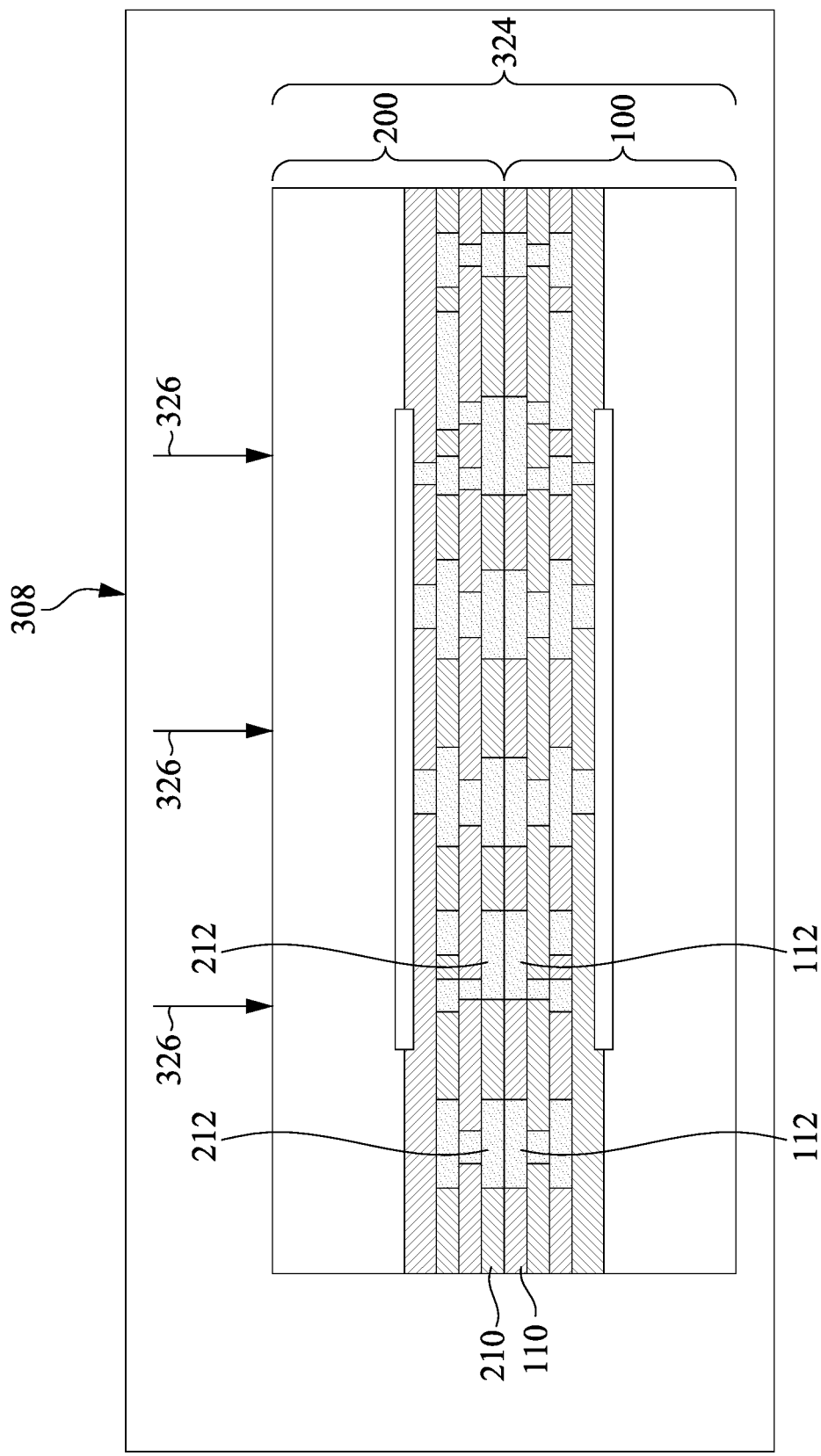
Figure 7:
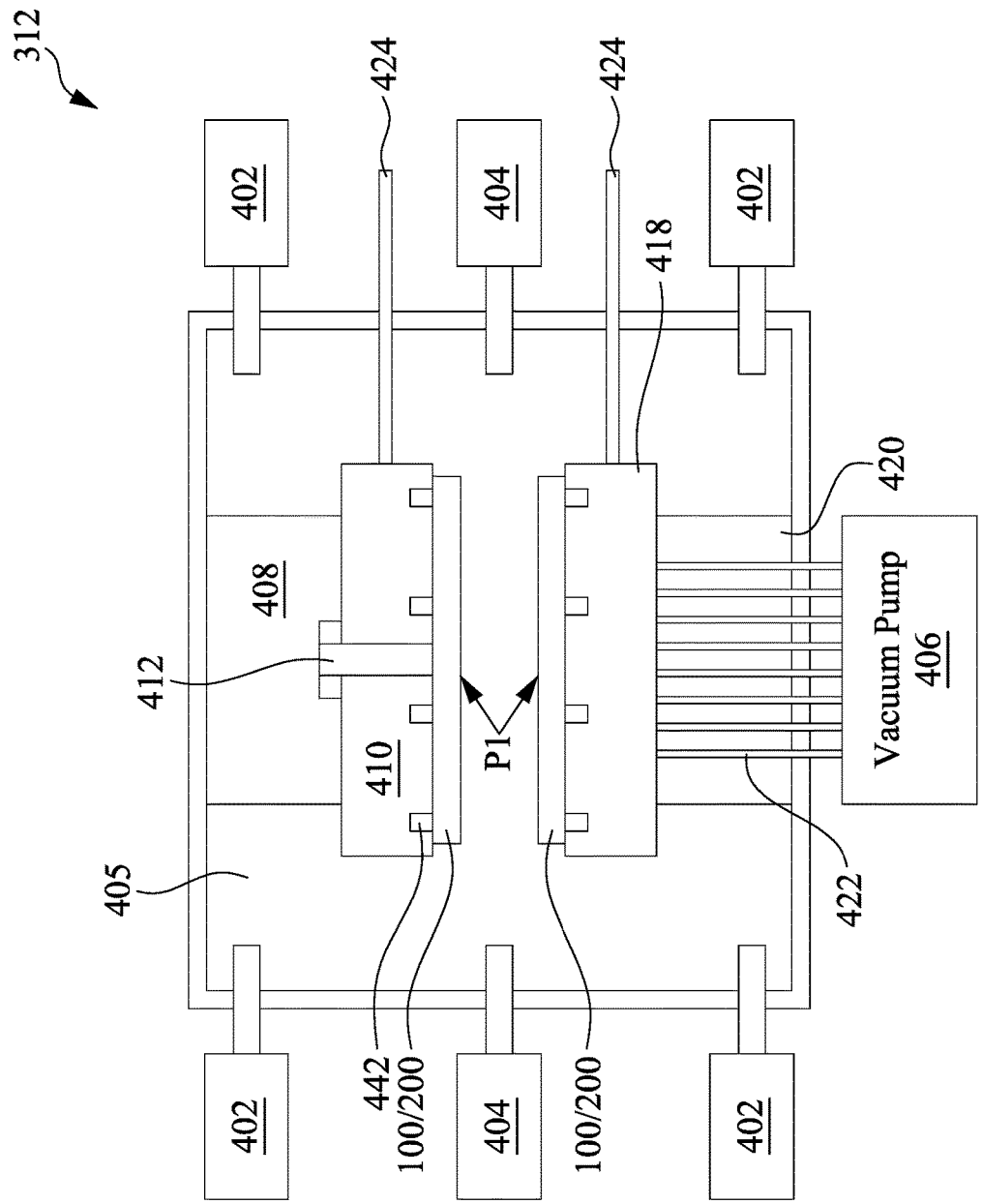
FIG. 7 illustrates a cross-sectional view of a wafer bonder in accordance with some embodiments.

FIG. 6 illustrates the package components 100 and 200 after bonding is completed in the bonding station 312 (shown subsequently in FIG. 7). Referring to FIG. 7, a schematic view, with a portion shown in cross section, of the bonding station 312 illustrated in accordance with an embodiment. The bonding station 312 illustrated herein is limited solely for the purpose of clearly illustrating the inventive aspects of the various embodiments. The present invention is not limited to any particular wafer bonding equipment. The bonding station 312 comprises a chamber 405, one or more gas outlets 404, and one or more gas inlets 402. An ambient pressure inside the chamber 405 can be controlled by flowing gas/air into the chamber 405 through the gas inlets 402 and removing gas/air from the chamber 405 via the gas outlets 404 through the use of one or more vacuum pumps connected to the gas outlets 404. The pressure of the chamber 405 can be controlled such that a pressure in the chamber 405 may range from a vacuum to above 760 torr (e.g., from about $1\times10^{-2}$ mbar to about 1520 torr). The bonding station 312 comprises a top wafer chuck 410 and a bottom wafer chuck 418 that can be positioned to face each other. In an embodiment, the top wafer chuck 410 and the bottom wafer chuck 418 can be used to bond two package components (e.g., the package component 100 to the package component 200) or two semiconductor wafers together. During the bonding process, cooling water is flowed through inlets 424 to the top wafer chuck 410 and the bottom wafer chuck 418 to cool the package components 100 and 200 to a temperature that may be in a range from about 15° C. to about 40° C.

In an embodiment the top wafer chuck 410 has a bottom surface that has a series of first openings 442 along the length of the bottom surface that are connected to a vacuum pump. During operation, the vacuum pump will evacuate any gases from the series of first openings 442 along the length of the bottom surface of the top wafer chuck 410, thereby lowering the pressure (also referred to as the chuck pressure) within these first openings 442. The chuck pressure may be in a range from about $1\times10^{-4}$ mbar to about 760 torr. When the package component 100/200 is placed against the bottom surface of the top wafer chuck 410 and the chuck pressure within the first openings 442 at the bottom surface of the top wafer chuck 410 has been reduced by the vacuum pump, the pressure difference (e.g., the difference between the pressure in the chamber 405 and the chuck pressure) between the side of the package component 100/200 facing the first openings 442 at the bottom surface of the top wafer chuck 410 and the side of the package component 100/200 facing away from the first openings 442 at the bottom surface of the top wafer chuck 410 will hold the package component 100/200 against the bottom surface of the top wafer chuck 410.

The bottom wafer chuck 418 has a top surface that is divided into zones (shown subsequently in FIGS. 8A through 8B) which are connected to a vacuum pump 406 through a series of pipes 422. Each zone is connected to a respective pipe 422 such that a vacuum pressure of that zone can be controlled independently from other zones of the bottom wafer chuck 418. The bottom wafer chuck 418 is used to hold the package component 100/200 that will be bonded to the package component 100/200 being held against the bottom surface of the top wafer chuck 410. In some embodiments, the top wafer chuck 410 also comprises a bottom surface that is divided into zones that are connected to a vacuum pump through a series of pipes in a way similar to the bottom wafer chuck 418.

To initiate a bonding process to bond the package component 100 and the package component 200, the top wafer chuck 410 and the bottom wafer chuck 418 are moved (e.g., by a motor) relative to each other such that they are aligned with each other in a way such that bond pads 112 of package component 100 are aligned to bond pads 212 of package component 200. In some embodiments, the top wafer chuck 410 is held at a fixed height and the bottom wafer chuck 418 is moved relative to the top wafer chuck 410 in a way such that bond pads 112 of package component 100 are aligned to bond pads 212 of package component 200. In some embodiments, the bottom wafer chuck 418 is held at a fixed height and the top wafer chuck 410 is moved relative to the bottom wafer chuck 418 in a way such that bond pads 112 of package component 100 are aligned to bond pads 212 of package component 200. Once aligned, the package component 100 and the package component 200 are brought into contact at a first point P1 by utilizing a push pin 412 to apply pressure against the package component 100/200 being held against the bottom surface of the top wafer chuck 410. This warps the package component 100/200 being held against the bottom surface of the top wafer chuck 410 and ensures that the first point P1 is the first point of contact between the package component 100 and the package component 200 which then begin to bond at the first point P1. The bonding then proceeds in a wave (also referred to as a bonding wave) from the first point P1 and moving outwards towards the edges of the package component 100 and the package component 200. During the bonding process to bond the package component 100 and the package component 200 the pressure of the chamber 405 can be controlled to be higher than 760 torr. The bonding wave velocity is dependent on a number of parameters and can be described by the expression $$V \alpha \frac{W^{5/4} h_0^{1/2}}{\mu D^{1/4}}$$

where V is the bonding wave velocity of the bonding wave, W is the bond energy, ho is the initial bond gap, µ is the viscosity of air in the chamber 405, and D is the flexural rigidity of air in the chamber 405. By controlling the ambient pressure of the chamber 405 to be higher than 760 torr, the bonding wave velocity V is reduced, which provides some advantages. The lower bond wave velocity V helps to minimize local stresses in the package component 100 and the package component 200 and minimizes bonding-induced distortion. This leads to improved bonding alignment between the package component 100 and the package component 200.

The surface treatment performed on the surfaces of the package component 100 (or 200) in the surface treatment station 306 may also influence the bond energy W and hence the bond wave velocity V. In some embodiments, the surface treatment includes a plasma treatment, and a higher number of OH groups activated on the surface of dielectric layer 110 of the package component 100 will lead to a larger bond energy W, and therefore the higher bonding wave velocity V. If a double sided activation is carried out to activate OH groups on surfaces of both the package component 100 and the package component 200 this will lead to a higher bond energy W than if only a single sided activation was carried out where only one of the package component 100 or the package component 200 has activated OH groups on its surface. As a result, the double sided activation will lead to a larger bonding wave velocity V during the bonding process to bond the package component 100 and the package component 200.

In some embodiments, during the bonding process to bond the package component 100 and the package component 200, the ambient pressure of the chamber 405 can be controlled to be lower than 760 torr (e.g., a vacuum, or the like). The bonding wave velocity V increase as a result, which provides some advantages. The increased bond wave velocity V leads to a reduced bonding time needed to bond the package component 100 to the package component 200 and this allows the wafer bonding system 300 to bond package components or wafers together at a faster rate and therefore increase the wafer per hour (WPH) processing rate.

Figure 8B:
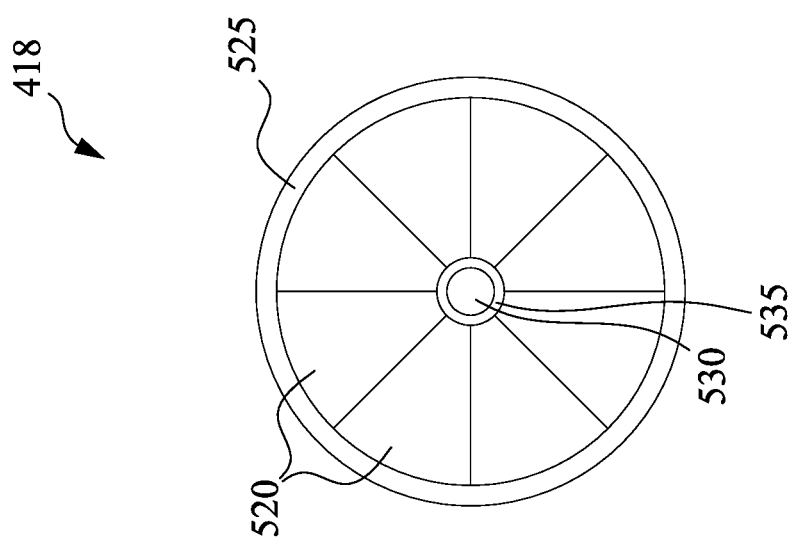
FIGS. 8A through 8B illustrate top-views of a bottom wafer chuck of the wafer bonder in accordance with some embodiments.
Figure 8A:
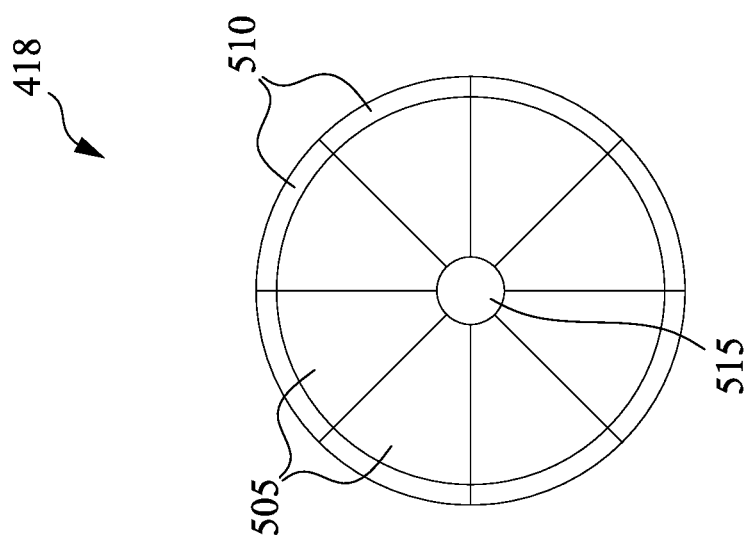

FIG. 8A illustrates a top-view chuck design of the bottom wafer chuck 418 that has a top surface that is divided into nine or more zones which are connected to a vacuum pump 406 through a series of pipes 422 (shown previously in FIG. 7). Each zone is connected to a respective pipe 422 such that a vacuum pressure of that zone can be controlled independently from other zones of the bottom wafer chuck 418. The bottom wafer chuck 418 is used to hold the package component 100/200 that will be bonded to the package component 100/200 being held against the bottom surface of the top wafer chuck 410. In an embodiment in which the package component 100/200 being held on the bottom wafer chuck 418 comprises a semiconductor wafer, the vacuum pressure of each zone of the bottom wafer chuck 418 can be tuned in order to control the mechanical properties (e.g., young's modulus and shear modulus) of the semiconductor wafer in each zone on the bottom wafer chuck 418. The bonding wave velocity V is dependent on the mechanical properties of the semiconductor wafer, and the mechanical properties are in turn dependent on the crystal directions of the semiconductor wafer. Hence, the bonding wave velocity V is different for different crystal directions and tuning the vacuum pressure of each zone allows the control of the bonding wave velocity V in that zone.

In FIG. 8A, the bottom wafer chuck 418 has a chuck design that comprises an inner zone 515, intermediate zones 505, and outer zones 510 in which a vacuum pressure of each inner zone 515, intermediate zone 505, and outer zone 510 can be controlled independently from other zones of the bottom wafer chuck 418. For example, to obtain a more uniform bonding wave velocity V during bonding, a semiconductor wafer being held on the bottom wafer chuck 418 may have a vacuum pressure in the inner zone 515 that is different than vacuum pressures in the intermediate zones 505 and the vacuum pressures in the intermediate zones 505 may be different than the vacuum pressures in the outer zones 510. FIG. 8B illustrates a top-view chuck design of another embodiment of the bottom wafer chuck 418 in which the chuck design comprises a first inner zone 530, a second inner zone 535, intermediate zones 520, and an outer zone 525 in which a vacuum pressure of each of the first inner zone 530, the second inner zone 535, the intermediate zones 520, and the outer zone 525 can be controlled independently from other zones of the wafer chuck 418. For example, to obtain a more uniform bonding wave velocity V during bonding, a semiconductor wafer being held on the bottom wafer chuck 418 may have a vacuum pressure in the first inner zone 530 that is different than the vacuum pressure in the second inner zone 535, the vacuum pressure in the second inner zone 535 may be different than the vacuum pressures in the intermediate zones 520 and the vacuum pressures in the intermediate zones 520 may be different than the vacuum pressure in the outer zone 525.

After the bonding process to bond the package component 100 and the package component 200, the bonded package components may then be transferred to the loading station 302 (shown in FIG. 2) by the transfer robot 303 where the package components are unloaded from the wafer bonding system 300.

In accordance with an embodiment, a wafer bonding system includes a chamber; a gas inlet and a gas outlet configured to control a pressure of the chamber to be in a range from $1 \times 10^{-2}$ mbar to 1520 torr; a first wafer chuck having a first surface to support a first wafer; and a second wafer chuck having a second surface to support a second wafer, the second surface being opposite the first surface, the second wafer chuck and the first wafer chuck being movable relative to each other, where the second surface that supports the second wafer is divided into zones, where a vacuum pressure of each zone is controlled independently of other zones. In an embodiment, gas/air is removed from the chamber through the gas outlet using a vacuum pump and gas/air is flowed through the gas inlet into the chamber to control the pressure of the chamber. In an embodiment, each zone of the second surface of the second wafer chuck is connected to a vacuum pump through a respective pipe. In an embodiment, the second surface of the second wafer chuck includes nine or more zones. In an embodiment, the first wafer chuck and the second wafer chuck are configured to flow cooling water through the first wafer chuck and the second wafer chuck. In an embodiment, the first surface of the first wafer chuck that supports the first wafer is divided into zones, where a vacuum pressure of each zone is controlled independently of other zones. In an embodiment, the first wafer chuck includes a push pin proximate a substantially central region thereof, and where during a bonding process for the first wafer and the second wafer, pressure is applicable using the push pin to the first wafer.

In accordance with an embodiment, a method includes coupling a first wafer to a first surface of a first wafer chuck and a second wafer to a second surface of a second wafer chuck in a chamber, where the first surface of the first wafer chuck includes a plurality of zones, where a vacuum pressure of each zone of the plurality of zones is independently controllable from the rest of the plurality of zones; modulating pressure of the chamber to be at a first pressure by flowing in air/gases into the chamber or removing air/gases from the chamber; and bonding the second wafer and the first wafer together by pressing the second wafer against the first wafer, where the bonding takes place at a first bonding wave velocity that is dependent on the first pressure. In an embodiment, the first pressure is in a range from $1\times10^{-2}$ mbar to 1520 torr. In an embodiment, the plurality of zones includes at least nine zones. In an embodiment, prior to coupling the first wafer to the first surface of the first wafer chuck and the second wafer to the second surface of the second wafer chuck performing a plasma activation on a surface of at least one of the first wafer or the second wafer. In an embodiment, during the bonding the second wafer to the first wafer a push pin is used to apply pressure to the second wafer in order to contact the first wafer at a first point. In an embodiment, during the bonding the second wafer to the first wafer cooling water is flowed through the first wafer chuck and the second wafer chuck. In an embodiment, each of the plurality of zones is connected to a first vacuum pump through a respective pipe. In an embodiment, the second wafer chuck and the first wafer chuck are movable relative to each other.

In accordance with an embodiment, a method includes performing a plasma activation on a surface of at least one of a first package component or a second package component; supporting the first package component on a first surface of a first wafer chuck in a chamber, where different zones of the first surface of the first wafer chuck have vacuum pressures that are independently controllable; supporting the second package component on a second surface of a second wafer chuck in the chamber, the second wafer chuck facing the first wafer chuck; and bonding the first package component to the second package component, where the bonding includes modulating pressure of the chamber to be at a first pressure; and applying pressure to the second package component using a push pin such that the second package component contacts the first package component at a first point and coupling of the second package component to the first package component takes place from the first point moving outwards towards edges of the first package component and the second package component at a first bonding wave velocity, where the first bonding wave velocity is based on the first pressure. In an embodiment, the method further includes tuning a vacuum pressure of each zone of the first surface of the first wafer chuck to control mechanical properties of a portion of the first package component being supported on that zone. In an embodiment, the first wafer chuck includes nine or more zones. In an embodiment, modulating pressure of the chamber includes removing gases/air from the chamber through a gas outlet or flowing gases/air into the chamber through a gas inlet. In an embodiment, after modulating pressure of the chamber, the first pressure of the chamber is in a range from $1\times10^{-2}$ mbar to 1520 torr.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of bonding wafers, the method comprising:
   coupling a first wafer to a first surface of a first wafer chuck and a second wafer to a second surface of a second wafer chuck in a chamber, wherein the first surface of the first wafer chuck comprises a plurality of zones, wherein a vacuum pressure of each zone of the plurality of zones is independently controllable from the rest of the plurality of zones, wherein the first surface is also a topmost surface of the first wafer chuck, and the second surface is also a bottommost surface of the second wafer chuck, and wherein a width of the first wafer chuck is greater than a width of the first wafer;
   modulating pressure of the chamber to be at a first pressure by flowing in air/gases into the chamber or removing air/gases from the chamber; and
   bonding the second wafer and the first wafer together by pressing the second wafer against the first wafer, wherein the bonding takes place at a first bonding wave velocity that is dependent on the first pressure.

2. The method of claim 1, wherein the first pressure is in a range from $1\times10^{-2}$ mbar to 1520 torr.

3. The method of claim 1, wherein the plurality of zones comprises at least nine zones.

4. The method of claim 1, wherein prior to coupling the first wafer to the first surface of the first wafer chuck and the second wafer to the second surface of the second wafer chuck performing a plasma activation on a surface of at least one of the first wafer or the second wafer.

5. The method of claim 1, wherein during the bonding the second wafer to the first wafer a push pin is used to apply pressure to the second wafer in order to contact the first wafer at a first point.

6. The method of claim 1, wherein during the bonding the second wafer to the first wafer cooling water is flowed through the first wafer chuck and the second wafer chuck.

7. The method of claim 1, wherein each of the plurality of zones is connected to a first vacuum pump through a respective pipe.

8. The method of claim 1, wherein the second wafer chuck and the first wafer chuck are movable relative to each other.

9. A method comprising:
   performing a plasma activation on a surface of at least one of a first package component or a second package component;
   supporting the first package component on a wafer platen;
   performing a cooling process to cool the first package component, wherein the cooling process comprises flowing water through the wafer platen;
   after performing the cooling process, supporting the first package component on a first surface of a first wafer chuck in a chamber, wherein different zones of the first surface of the first wafer chuck have vacuum pressures that are independently controllable;
   supporting the second package component on a second surface of a second wafer chuck in the chamber, the second wafer chuck facing the first wafer chuck; and
   bonding the first package component to the second package component, wherein the bonding comprises:
     modulating pressure of the chamber to be at a first pressure; and
     applying pressure to the second package component using a push pin such that the second package component contacts the first package component at a first point and coupling of the second package component to the first package component takes place from the first point moving outwards towards edges of the first package component and the second package component at a first bonding wave velocity, wherein the first bonding wave velocity is based on the first pressure.

10. The method of claim 9 further comprising tuning a vacuum pressure of each zone of the first surface of the first wafer chuck to control mechanical properties of a portion of the first package component being supported on that zone.

11. The method of claim 10, wherein the first wafer chuck comprises nine or more zones.

12. The method of claim 9, wherein modulating pressure of the chamber comprises removing gases/air from the chamber through a gas outlet or flowing gases/air into the chamber through a gas inlet.

13. The method of claim 12, wherein after modulating pressure of the chamber, the first pressure of the chamber is in a range from $1 \times 10^{-2}$ mbar to 1520 torr.

14. A method comprising:
   securing a first wafer to a first surface of a top wafer chuck and a second wafer to a second surface of a bottom wafer chuck, the top wafer chuck and the bottom wafer chuck being disposed in a chamber, wherein the second surface of the bottom wafer chuck comprises a first plurality of zones;
   tuning a young's modulus and a shear modulus of each portion of the second wafer that is secured to a respective zone of the first plurality of zones on the bottom wafer chuck;
   moving the top wafer chuck or the bottom wafer chuck to align the first wafer with the second wafer;
   applying pressure to the first wafer using a push pin disposed in the top wafer chuck to warp the first wafer and initiate contact between the first wafer and the second wafer at a first point, wherein during applying pressure to the first wafer using the push pin, bonding between the first wafer and the second wafer begins at the first point and proceeds outwards towards edges of the first wafer and the second wafer; and
   during applying pressure to the first wafer using the push pin, modulating pressure of the chamber to be at a first pressure.

15. The method of claim 14, wherein the first pressure is modulated to be higher than 760 torr.

16. The method of claim 14, wherein the first pressure is modulated to be lower than 760 torr.

17. The method of claim 14, wherein modulating pressure of the chamber to be at the first pressure comprises removing gas/air from the chamber through a gas outlet using a vacuum pump, and flowing gas/air into the chamber through a gas inlet.

18. The method of claim 14, wherein the first surface of the top wafer chuck comprises a second plurality of zones, wherein a vacuum pressure of each zone of the second plurality of zones is independently controllable from the rest of the second plurality of zones.

19. The method of claim 18, wherein each zone of the second plurality of zones is connected to a vacuum pump through a respective pipe.

20. The method of claim 14, wherein tuning the young's modulus and the shear modulus of each portion of the second wafer comprises independently tuning a vacuum pressure of each zone of the first plurality of zones.

* * * * *